United States Patent
Tsutsui

(10) Patent No.: US 8,183,559 B2
(45) Date of Patent: May 22, 2012

(54) ORGANIC FIELD EFFECT TRANSISTOR

(75) Inventor: Tetsuo Tsutsui, Kasuga (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 10/441,214

(22) Filed: May 20, 2003

(65) Prior Publication Data

US 2003/0218166 A1    Nov. 27, 2003

(30) Foreign Application Priority Data

May 21, 2002 (JP) ................. 2002-146428

(51) Int. Cl.
*H01L 51/00* (2006.01)
*H01L 29/04* (2006.01)
(52) U.S. Cl. ............ 257/40; 257/59; 257/72; 257/288; 438/99
(58) Field of Classification Search .......... 257/40, 257/59, 72, 213, 288, 314, 315, 347; 438/82, 438/99
See application file for complete search history.

(56) References Cited

U.S. PATENT DOCUMENTS

| | | | |
|---|---|---|---|
| 4,003,632 A * | 1/1977 | Komiya et al. ............. 385/2 |
| 4,552,927 A | 11/1985 | Warren | |
| 4,871,236 A | 10/1989 | Gemma et al. | |
| 4,913,744 A * | 4/1990 | Hoegl et al. ............. 136/244 |
| 4,971,919 A | 11/1990 | Yamazaki | |
| 5,093,698 A | 3/1992 | Egusa | |
| 5,229,310 A | 7/1993 | Sivan | |
| 5,255,237 A * | 10/1993 | Kodama ............. 365/185.19 |
| 5,294,870 A | 3/1994 | Tang et al. | |
| 5,364,654 A | 11/1994 | Hosokawa et al. | |
| 5,454,880 A * | 10/1995 | Sariciftci et al. ............. 136/263 |
| 5,458,977 A | 10/1995 | Hosokawa et al. | |
| 5,462,628 A * | 10/1995 | Viehbeck et al. ............. 156/281 |
| 5,478,777 A | 12/1995 | Yamazaki | |
| 5,500,537 A * | 3/1996 | Tsumura et al. ............. 257/40 |
| 5,621,032 A * | 4/1997 | Cortelezzi et al. ............. 524/262 |
| 5,677,546 A | 10/1997 | Yu | |
| 5,682,043 A | 10/1997 | Pei et al. | |
| 5,684,320 A * | 11/1997 | Kawashima ............. 257/351 |
| 5,757,139 A | 5/1998 | Forrest et al. | |

(Continued)

FOREIGN PATENT DOCUMENTS

EP          0 215 683           3/1987

(Continued)

OTHER PUBLICATIONS

Webster's Third New Intenrational Dictionary, Unabridged (1993). Merriam-Webster, Inc., Springfield, MA (USA); on "surround".*

(Continued)

*Primary Examiner* — Johannes P Mondt
(74) *Attorney, Agent, or Firm* — Eric J. Robinson; Robinson Intellectual Property Law Office, P.C.

(57) ABSTRACT

In an organic field effect transistor, including, on a substrate having an insulating surface, at least a gate electrode, a gate insulating film formed in contact with the gate electrode, an organic semiconductor film formed in contact with the gate insulating film, and at least a pair of source-drain electrodes formed in contact with the organic semiconductor film, a carrier generating electrode to which carriers can be injected in response to a gate signal is implanted within the organic semiconductor film.

21 Claims, 9 Drawing Sheets

U.S. PATENT DOCUMENTS

| | | | |
|---|---|---|---|
| 5,821,690 A * | 10/1998 | Martens et al. | 313/506 |
| 5,837,391 A | 11/1998 | Utsugi | |
| 5,858,561 A | 1/1999 | Epstein et al. | |
| 5,955,835 A | 9/1999 | Oh et al. | |
| 5,965,063 A | 10/1999 | Agata et al. | |
| 5,970,318 A * | 10/1999 | Choi et al. | 438/99 |
| 5,982,345 A | 11/1999 | Takayama et al. | |
| 6,013,384 A | 1/2000 | Kido et al. | |
| 6,107,734 A | 8/2000 | Tanaka et al. | |
| 6,188,175 B1 | 2/2001 | May et al. | |
| 6,198,091 B1 | 3/2001 | Forrest et al. | |
| 6,198,092 B1 | 3/2001 | Bulovic et al. | |
| 6,278,055 B1 | 8/2001 | Forrest et al. | |
| 6,297,495 B1 | 10/2001 | Bulovic et al. | |
| 6,300,612 B1 | 10/2001 | Yu | |
| 6,329,085 B1 | 12/2001 | Burrows et al. | |
| 6,335,539 B1 | 1/2002 | Dimitrakopoulos et al. | |
| 6,337,492 B1 | 1/2002 | Jones et al. | |
| 6,344,660 B1 * | 2/2002 | Dimitrakopoulos et al. | 257/40 |
| 6,352,777 B1 | 3/2002 | Bulovic et al. | |
| 6,404,126 B1 | 6/2002 | Arai et al. | |
| 6,414,432 B1 | 7/2002 | Hieda et al. | |
| 6,423,429 B2 | 7/2002 | Kido et al. | |
| 6,451,415 B1 | 9/2002 | Forrest et al. | |
| 6,452,092 B2 | 9/2002 | Han et al. | |
| 6,483,123 B1 * | 11/2002 | Kim et al. | 257/40 |
| 6,486,601 B1 | 11/2002 | Sakai et al. | |
| 6,524,884 B1 * | 2/2003 | Kim et al. | 438/99 |
| 6,566,806 B1 | 5/2003 | Kawai | |
| 6,580,213 B2 | 6/2003 | Yamazaki | |
| 6,589,673 B1 | 7/2003 | Kido et al. | |
| 6,603,139 B1 | 8/2003 | Tessler et al. | |
| 6,614,176 B2 | 9/2003 | Kim et al. | |
| 6,651,871 B2 | 11/2003 | Ogure | |
| 6,692,820 B2 | 2/2004 | Forrest et al. | |
| 6,717,358 B1 | 4/2004 | Liao et al. | |
| 6,740,938 B2 | 5/2004 | Tsunoda et al. | |
| 6,844,025 B2 | 1/2005 | Forrest et al. | |
| 6,872,472 B2 | 3/2005 | Liao et al. | |
| 6,876,007 B2 | 4/2005 | Yamazaki et al. | |
| 6,914,272 B2 | 7/2005 | Goetz et al. | |
| 7,142,781 B2 | 11/2006 | Koyama et al. | |
| 7,378,133 B2 | 5/2008 | Yamazaki et al. | |
| 7,473,923 B2 | 1/2009 | Tsutsui | |
| 7,504,049 B2 | 3/2009 | Tsutsui et al. | |
| 7,511,421 B2 | 3/2009 | Tsutsui et al. | |
| 7,531,847 B2 | 5/2009 | Shitagaki et al. | |
| 2001/0031509 A1 | 10/2001 | Yamazaki | |
| 2001/0046611 A1 | 11/2001 | Kido et al. | |
| 2002/0028347 A1 | 3/2002 | Marrocco, III et al. | |
| 2002/0074935 A1 | 6/2002 | Kwong et al. | |
| 2002/0119297 A1 | 8/2002 | Forrest et al. | |
| 2002/0180349 A1 | 12/2002 | Aziz et al. | |
| 2002/0189666 A1 | 12/2002 | Forrest et al. | |
| 2002/0197462 A1 | 12/2002 | Forrest et al. | |
| 2003/0025166 A1 | 2/2003 | Yamazaki et al. | |
| 2003/0042846 A1 | 3/2003 | Forrest et al. | |
| 2003/0127967 A1 | 7/2003 | Tsutsui et al. | |
| 2003/0189401 A1 | 10/2003 | Kido et al. | |
| 2003/0209974 A1 | 11/2003 | Yamazaki | |
| 2004/0027059 A1 | 2/2004 | Tsutsui | |
| 2004/0027061 A1 | 2/2004 | Seo et al. | |
| 2004/0029310 A1 | 2/2004 | Bernds et al. | |
| 2004/0113546 A1 | 6/2004 | Forrest et al. | |
| 2004/0123804 A1 | 7/2004 | Yamazaki et al. | |
| 2004/0124505 A1 | 7/2004 | Mahle et al. | |
| 2004/0150333 A1 | 8/2004 | Tsutsui | |
| 2004/0151887 A1 | 8/2004 | Forrest et al. | |
| 2004/0256620 A1 | 12/2004 | Yamazaki et al. | |
| 2005/0012456 A1 | 1/2005 | Nakatsu et al. | |
| 2005/0023522 A1 * | 2/2005 | Frey et al. | 257/40 |
| 2005/0029933 A1 | 2/2005 | Liao et al. | |
| 2005/0156197 A1 | 7/2005 | Tsutsui et al. | |
| 2006/0091797 A1 | 5/2006 | Tsutsui et al. | |

FOREIGN PATENT DOCUMENTS

| | | |
|---|---|---|
| EP | 0 855 848 | 7/1998 |
| EP | 0 948 063 | 10/1999 |
| EP | 1017118 A | 7/2000 |
| JP | 60-028278 | 2/1985 |
| JP | 03-255669 | 11/1991 |
| JP | 04-049665 | 2/1992 |
| JP | 04-192376 | 7/1992 |
| JP | 06-151851 A | 5/1994 |
| JP | 06-176870 | 6/1994 |
| JP | 06-176870 A | 6/1994 |
| JP | 06-188074 A | 7/1994 |
| JP | 06-260286 A | 9/1994 |
| JP | 06-318725 | 11/1994 |
| JP | 10-199678 A | 7/1998 |
| JP | 10-270171 | 10/1998 |
| JP | 11-015408 A | 1/1999 |
| JP | 11-162646 | 6/1999 |
| JP | 11-251067 | 9/1999 |
| JP | 11-283750 A | 10/1999 |
| JP | 11-329748 | 11/1999 |
| JP | 11-329749 | 11/1999 |
| JP | 2000-260572 A | 9/2000 |
| JP | 2000-306676 A | 11/2000 |
| JP | 2000-315581 A | 11/2000 |
| JP | 2001-244074 | 9/2001 |
| JP | 2001-291592 | 10/2001 |
| JP | 2001-357975 | 12/2001 |
| JP | 2002-033193 | 1/2002 |
| JP | 2002-164170 | 6/2002 |
| JP | 2003-045676 | 2/2003 |
| JP | 2003-515933 | 5/2003 |
| JP | 2004/039617 | 2/2004 |
| JP | 2004-111085 | 4/2004 |
| WO | WO 95/06400 | 3/1995 |
| WO | WO 99/39372 | 8/1999 |
| WO | WO-99/54936 | 10/1999 |
| WO | WO 01/84644 | 11/2001 |
| WO | WO-02/15293 | 2/2002 |
| WO | WO 02/101838 | 12/2002 |
| WO | WO 2004/112440 | 12/2004 |

OTHER PUBLICATIONS

Merriam-Webster's Collegiate Dictionary, tenth Edition, pp. 605 and 1359, Merriam-Webster Inc., Springfield, MA (USA) (ISBN: 0-87779-709-9 (1999).*

Shirakawa et al., Synthesis of Electrically Conducting Organic Polymers: Halogen Derivatives of Polyacetylene, $(CH)_x$, J.C.S. Chem. Comm., 1977, pp. 578-580.

Fuchigami et al., Polythienylenevinylene Thin-Film Transistor with High Carrier Mobility, Appl. Phys. Lett., vol. 63, No. 10, Sep. 6, 1993, pp. 1372-1374.

Gundlach et al., "Pentacene Organic Thin-Film Transistors-Molecular Ordering and Mobility," IEEE Electron Device Letters, vol. 18, No. 3, Mar. 1997, pp. 87-89.

Narayan et al., "Light Responsive Polymer Field-Effect Transistor," Appl. Phys. Lett., vol. 79, No. 12, Sep. 17, 2001, pp. 1891-1893.

Junji Kido et al., Dai 49 Kai Ouyou Butsuri Gakkai Kankei Rengo Kouenkai Kouen yokoushu, Lecture Drafts for the $49^{th}$ Applied Physics Society Related Union Lecture, p. 1308, 27p-YL-3, Mar. 2002.

T. Tsutsui, *Mechanism of Organic EL Element and Luminous Efficiency*, Textbook of the $3^{rd}$ Seminar at Division of Organic Molecular Electronics and Bioelectronics, The Japan Society of Applied Physics, Jan. 1, 1993, pp. 31-37.

C.W. Tang et al., *Organic Electroluminescent Diodes*, Appl. Phys. Lett., vol. 51, No. 12, Sep. 21, 1987, pp. 913-915.

G. Parthasarathy et al., *A Metal-Free Cathode for Organic Semiconductor Devices*, Appl. Phys. Lett., vol. 72, No. 17, Apr. 27, 1998, pp. 2138-2140.

C.W. Tang, *Two-Layer Organic Photovoltaic Cell*, Appl. Phys. Lett., vol. 48, No. 2, Jan. 13, 1986, pp. 183-185.

Y. Sato, *Problem for Implementation in View of Materials Development*, The Japan Society of Applied Physics/Organic Molecular Electronics and Bioelectronics, vol. 11, No. 1, Jan. 1, 2000, pp. 86-99.

M. Hiramoto et al., *Effect of Thin Gold Interstitial-Layer on the Photovoltaic Properties of Tandem Organic Solar Cell*, Chemistry Letters, The Chemical Society of Japan, Jan. 1, 1990, pp. 327-330.

J. Ferraris, et al., *Electron Transfer in a New Highly Conducting Donor-Acceptor Complex*, Journal of the American Chemical Society, vol. 95:3, Feb. 7, 1973, pp. 948-949.

Specification, Claims, Abstract, of U.S. Appl. No. 10/763,101.

G. Yu et al., *Charge Separation and Photovoltaic Conveision in Polymer Composites with Internal Donor/Acceptor Heterojunctions*, J. Appl. Phys., vol. 78, No. 7, Oct. 1, 1995, pp. 4510-4515.

B. Ruhstaller et al., *Bias-Tuned Reduction of Self-Absorption in Polymer Blend Electroluminescence*, Chemical Physics Letters, vol. 317, Feb. 4, 2000, pp. 238-244.

J.H. Schön et al., *Ambipolar Pentacene Field-Effect Transistors and Invertors*, Science, vol. 287, Feb. 11, 2000, pp. 1022-1023.

L.S. Liao et al., *High-Efficiency Tandem Organic Light-Emitting Diodes*, Applied Physics Letters, vol. 84, No. 2, Jan. 12, 2004, pp. 167-169.

Search Report (Application No. 03010847.6) Dated Jun. 24, 2009.

Hung.L et al., "Enhanced Electron Injection in Organic Electroluminescence Devices Using an AL/LiF Electrode,", Appl. Phys. Lett. (Applied Physics Letters), Jan. 13, 1997, vol. 70, No. 2, pp. 152-154.

Chen,C et al., "Recent Developments in Molecular Organic Electroluminescent Materials,", Macromol. Symp.(Macromolecular Symposia), 1997, vol. 125, pp. 1-48.

Guo.X et al., "High Efficiency Tunneling-Regenerated Multi-Active Region Light Emitting Diodes,", Optoelectronic Materials and Devices II,Proceedings of SPIE, 2000, vol. 4078, pp. 170-179.

\* cited by examiner

ORGANIC FIELD EFFECT TRANSISTOR

BACKGROUND OF THE INVENTION

1. Field of the Invention

The present invention relates to an organic field effect transistor (called "organic FET" hereinafter) using an organic semiconductor material. More specifically, the invention relates to an organic thin film transistor (called "organic TFT" hereinafter) using a thin film containing an organic semiconductor material.

2. Description of the Related Art

In various semiconductor apparatus incorporating semiconductor elements, such as a television receiver, a personal computer and a mobile telephone, a display for displaying text and/or images is required by human beings for recognizing information. Recently, flat panel displays have been positively used such as a liquid crystal display using an electrooptic characteristic of liquid crystal and an organic EL display using electric field emitted light of an organic material.

As one form of the flat panel display, an active matrix driving method has been known in which a thin film transistor (TFT) is provided for each pixel and data signals are sequentially written for video display. A TFT may be an element required for implementing the active matrix driving method.

It is important to note that most of field effect transistors (FET) such as the TFT have been produced by using inorganic semiconductor materials such as amorphous silicon and crystalline silicon. However, when the FET is formed by using these inorganic semiconductor materials, the substrate processing temperature in the process for producing a semiconductor layer, for example, exceeds 350° C. As a result, many of useful substrate materials (such as plastic) cannot be used. This is a disadvantage.

When an FET is produced by using current inorganic semiconductor materials, the insulating layer and semiconductor layer and the electrode are formed by using a plasma CVD apparatus and a sputtering apparatus, respectively. However, these CVD apparatus and sputtering apparatus are relatively expensive and need time for the maintenance.

On the other hand, a method has been proposed for producing an FET by using organic semiconductor materials. An organic compound itself dose not have carriers and has a good insulating characteristic essentially. However, current can be conducted through the organic compound by using a series of materials called organic semiconductor materials (or a conjugate organic compound, in general).

For example, like a conductive high polymer, acceptors (electron acceptors) or donors (electron donors) are doped to the π conjugate organic compound such that the π conjugate organic compound can have carriers due to impurities. Therefore, the conductivity can be caused (see Document 1: "CHEMISTRY COMMUNICATION", Vol. 16, pgs. 578-580, Hideki SHIRAKAWA et al, 1977). By increasing the doped amount, the amount of carriers increases to a certain range. Therefore, the dark conductivity increases therefor, and a more amount of current can flow threthrough.

In this way, the measure for increasing the dark conductivity by doping impurities (such as acceptors and donors) in order to conduct current through an organic semiconductor material has been partially applied in the electronics field. The examples include a chargeable secondary battery using polyaniline and/or polyacene and a field effect capacitor using polypyrrole.

By applying such a measure for an organic semiconductor material, an organic FET can operate. The organic FET has basically the same construction as a conventional FET using an inorganic semiconductor material except that an organic semiconductor material is used as an active layer instead of an inorganic semiconductor material (the active layer containing an organic semiconductor material is called "organic semiconductor film" hereinafter). Many reports have been made on this kind of organic FET.

For example, an organic TFT has been reported using, as an active layer, poly (2, 5-polythienylenevinylene) (called "PTV" hereinafter), which is a kind of conductive high polymer material. The report is provided in Document 2, "Applied Physics Letters", Vol. 63, pgs. 1372-1374, H. Fuchigami et al., 1993. The PTV described in Document 2 is doped to p-type by oxygen in the air, which is weak acceptor and exposes moderate conductivity as an active layer. In this way, the conductivity of conductive high polymer materials can be controlled easily by doping. Therefore, conductive high polymer materials gathers attentions as materials to be used in an organic FET.

In Document 2, moderate current may flow between the source and the drain by applying the method for causing carriers in an organic semiconductor film by doping impurities. The organic FET is called "dope-type organic FET" hereinafter.

On the other hand, for example, an organic FET may be produced by using a fine crystalline thin film containing a low polymer organic semiconductor material without doping an impurity to an organic semiconductor film. This example is described in Document 3: "IEEE Electron Device Letters", Vol. 18, pgs. 87 to 89, D.J. Gandranch et al, 1997. In Document 3, a silicon oxide film is formed on a high-dope silicon wafer as an insulating film. Then, fine crystal of pentacene, that is an organic semiconductor material, is stacked thereon by vacuum evaporation. Furthermore, a source electrode and drain electrode of gold are formed thereon. As a result, an organic FET can be obtained.

In Document 3, carriers due to impurities do not exist in the organic semiconductor film. However, since a fine crystal thin film with higher mobility is used, carriers injected from the source and drain can move. Therefore, the result can operate as an FET, which is called "carrier-injected organic FET" hereinafter.

These kinds of organic FET can be formed at a lower substrate temperature. Therefore, a flexible substrate of plastic, for example, can be applied. Furthermore, the organic FET other than a monocrystal thin film and a fine crystal thin film can be formed easily by general vapor deposition or spin coating. Therefore, the production process can be simplified and can save energy. Because of these advantages, an organic FET is gathering attentions as a new FET instead of an FET containing an inorganic semiconductor material.

However, a conventional organic FET as described above has problems due to impurities (acceptors and/or donors) or the characteristics of the organic semiconductor film itself.

First of all, as described in Document 2, when acceptors and/or donors are doped to an organic semiconductor material so as to cause carriers therein (that is, in the case of the dope-type organic FET), the acceptors and/or donors themselves are not chemically stable, and the production is not easy. For example, alkali metal and alkali earth metal can be used as the donors. However, the donors themselves are extremely active to water, oxygen and so on. Therefore, the use may be difficult.

Furthermore, when an impurity is doped to an organic semiconductor material, electrons are exchanged between the organic semiconductor material and the impurity, that is, a kind of chemical reaction occurs. Therefore, the doped condition itself may not be stable.

On the other hand, in the case of a carrier-injected organic FET as disclosed in Document 3, the organic semiconductor material does not need to have carriers. Therefore, problems relating to unstableness due to acceptors and/or donors do not occur. However, in order for injected carriers to flow between the source and the drain, an organic semiconductor film having higher mobility than conventional one is required in consideration of the distance between the current source and drain. Therefore, monocrystal or fine crystal must be used presently. A monocrystal thin film and fine crystal thin film containing an organic semiconductor material are difficult to produce and are not realistic. This is another disadvantage.

Furthermore, when it is assumed that a monocrystal thin film and a fine crystal thin film can be formed, a high polymer material is basically difficult to use. Thus, forming a thin film by wet coating is not easy. This is another disadvantage. Because of these disadvantages, the number of material selections are limited for a carrier injected type organic FET.

In view of these disadvantages, an organic semiconductor film produced by using an extremely common vapor deposition film and/or coated film is desirably used to operate an FET without adding acceptors and donors and without using monocrystal and fine crystal.

For example, an attempt has been made in which carriers are caused by optically exciting an organic semiconductor film and by feeding current due to the carriers between the source and the drain. Thus, an FET can be operated. The attempt is described in Document 4: "Applied Physics Letters", Vol. 79, No. 12. pgs. 1891-1893, K.S. Narayan et al., 2001.

The improvement in operational function as an FET is proved where carriers can be caused in an organic semiconductor film by light irradiation. However, in the method disclosed in Document 4, the step of the moderate light irradiation is further required for the FET operation. Therefore, in order to operate the FET only electrically, the method is not suitable and is not a realistic solution.

SUMMARY OF THE INVENTION

Accordingly, it is an object of the invention to provide an organic FET having a stable thin film by proposing a novel organic FET structure, which can be operate sufficiently, without using an organic semiconductor film to which an impurity is doped.

It is another object of the invention to provide an organic FET having a wide variety of material selection, which can be produced easily, by providing a novel organic FET structure, which can operate sufficiently without applying an organic semiconductor film of monocrystal and/or fine crystal and without using a general vapor deposition film and/or coated film.

The present inventor has proposed the solution to the above-described problems as a result of many examinations. The solution is to embed an electrode in an organic semiconductor film as a floating electrode. Here, carriers can be injected to the electrode to be embedded. The floating electrode is called "carrier generating electrode" hereinafter. In other words, the invention is designed to inject carriers to an organic semiconductor film from a carrier generating electrode, that is a floating electrode in the organic semiconductor film by applying voltage to a gate electrode.

In this case, carriers only exist in an active layer when voltage is applied to the gate. Therefore, the current flowing between the source and the drain can be ON/OFF-controlled by the gate voltage. With this construction, an impurity does not have to be doped to an organic semiconductor film to cause carriers therein. Furthermore, since carrier injected from the carrier generating electrode, that is a floating electrode, is used, monocrystal or fine crystal with higher mobility does not have to be used. Thus, an organic FET can be used easily.

According to one aspect of the invention, there is provided an organic field effect transistor, including, on a substrate having an insulating surface, at least a gate electrode, a gate insulating film formed in contact with the gate electrode, an organic semiconductor film formed in contact with the gate insulating film, and at least a pair of source-drain electrodes formed in contact with the organic semiconductor film. In this case, a carrier generating electrode is implemented within the organic semiconductor film.

The carrier generating electrode generally emits electrons and holes in opposite directions to each other. Therefore, the constructions shown in FIGS. 1A to 2B are preferable.

In other words, as shown in FIG. 1A, an organic field effect transistor according to another aspect of the invention, including a first gate electrode 102 formed in contact with an insulating surface on a substrate 101, a first gate insulating film 103 formed in contact with the first gate electrode 102, a first source electrode 104a and first drain electrode 104b formed in contact with the first gate insulating film 103, an organic semiconductor film 105 formed in contact with the first source electrode 104a, the first drain electrode 104b and the first gate insulating film 103, a carrier generating electrode 106 within the organic semiconductor film 105, a second source electrode 107b and second drain electrode 107a formed in contact with the organic a semiconductor film 105, a second gate insulating film 108 formed in contact with the organic semiconductor film 105, and a second gate electrode 109 formed in contact with the second gate insulating film 108.

As shown in FIG. 1B, an organic semiconductor film may include the first organic semiconductor film 105a and the second organic semiconductor film 105b, and the carrier generating electrode 106 may be provided therebetween. Therefore, as shown in FIG. 1B, according to another aspect of the invention, there is provided an organic field effect transistor, including a first gate electrode 102 formed in contact with an insulating surface on a substrate 101, a first gate insulating film 103 formed in contact with the first gate electrode 102, a first source electrode 104a and first drain electrode 104b formed in contact with the first gate insulating film 103, a first organic semiconductor film 105a formed in contact with the first source electrode 104a, the first drain electrode 104b and the first gate insulating film 103, a carrier generating electrode 106 formed in contact with the first organic semiconductor film 105a, a second organic semiconductor film 105b formed in contact with the carrier generating electrode 106, a second source electrode 107b and second drain electrode 107a formed in contact with the second organic semiconductor film 105b, a second gate insulating film 108 formed in contact with the second organic semiconductor film 105b, and a second gate electrode 109 formed in contact with the second gate insulating film 108.

Preferably, in this case, the first organic semiconductor film 105a is hole transportable, and the second organic semiconductor film 105b is electron transportable. Conversely, the first organic semiconductor film 105a may be electron transportable, and the second organic semiconductor film 105b may be hole transportable.

In the organic field effect transistors shown in FIGS. 1A and 1B, the carrier generating electrode 106 preferably includes at least an electron implanted electrode and a hole implanted electrode.

In the organic field effect transistors according to these aspects of the invention, the first source electrode 104a and the second source electrode 107b may be connected. Alternatively, the first drain electrode 104b and the second drain electrode 107a may be connected.

The invention is much preferable because the invention can operate even with the construction shown in FIGS. 2A and 2B. In other words, as shown in FIG. 2A, according to another aspect of the invention, there is provided an organic field effect transistor, including a first gate electrode 202 formed in contact with an insulating surface on a substrate 201, a first gate insulating film 203 formed in contact with the first gate electrode 202, a first electrode 204 formed in contact with the first gate insulating film 203, an organic semiconductor film 205 formed in contact with the first electrode 204 and the first gate insulating film 203, a carrier generating electrode 206 within the organic semiconductor film 205, a second electrode 207 formed in contact with the organic semiconductor film 205, a second gate insulating film 208 formed in contact with the organic semiconductor film 205, and a second gate electrode 209 formed in contact with the second gate insulating film 208. The first electrode and the second electrode function as the source and the drain, respectively.

As shown in FIG. 2B, an organic semiconductor film may include the first organic semiconductor film 205a and the second organic semiconductor film 205b, and the carrier generating electrode 206 may be provided therebetween. According to another aspect of the invention, there is provided an organic field effect transistor, including a first gate electrode 202 formed in contact with an insulating surface on a substrate 201, a first gate insulating film 203 formed in contact with the first gate electrode 202, a first electrode 204 formed in contact with the first gate insulating film 203, a first organic semiconductor film 205a formed in contact with the first electrode 204 and the first gate insulating film 203, a carrier generating electrode 206 formed in contact with the first organic semiconductor film 205a, a second organic semiconductor film 205b formed in contact with the carrier generating electrode 206, a second electrode 207 formed in contact with the second organic semiconductor film 205b, a second gate insulating film 208 formed in contact with the second organic semiconductor film 205b, and a second gate electrode 209 formed in contact with the second gate insulating film 208. The first electrode and the second electrode function as the source and the drain, respectively.

Preferably, in this case, the first organic semiconductor film 205a is hole transportable, and the second organic semiconductor film 205b is electron transportable. Conversely, the first organic semiconductor film 205a may be electron transportable, and the second organic semiconductor film 205b may be hole transportable.

In the organic field effect transistors in FIGS. 2A and 2B, the carrier generating electrode 206 preferably includes at least an electron implanted electrode and a hole implanted electrode.

Accordingly, by implementing the invention, an organic FET having a stable thin film can be provided because an organic FET can be produced which can operate sufficiently without using an organic semiconductor film to which an impurity is doped. Furthermore, because an organic FET is produced which can operate sufficiently without applying an organic semiconductor film of monocrystal and/or fine crystal and with using a general vapor deposition film and/or coated film, an organic FET having a wide variety of material selection, which can be produced easily, can be provided.

DESCRIPTION OF THE PREFERRED EMBODIMENTS

Embodiments of the invention will be described below in detail with reference to the operational principle and specific construction examples.

First of all, the inventor noted the concept of a charge generating layer proposed in the field of organic electroluminescent element (called "organic EL element" hereinafter). In the organic EL element field, a charge generating layer has been a publicly known technology (see Document 5: Dai 49 Kai Ouyou Butsuri Gakkai Kankei Rengo Kouenkai Kouen yokoushu (Lecture Drafts for the 49th Applied Physics Society Related Union Lecture), Junji KIDO et al, pgs. 1308, 27 p-YL-3, March 2002.)

Figure 3A:
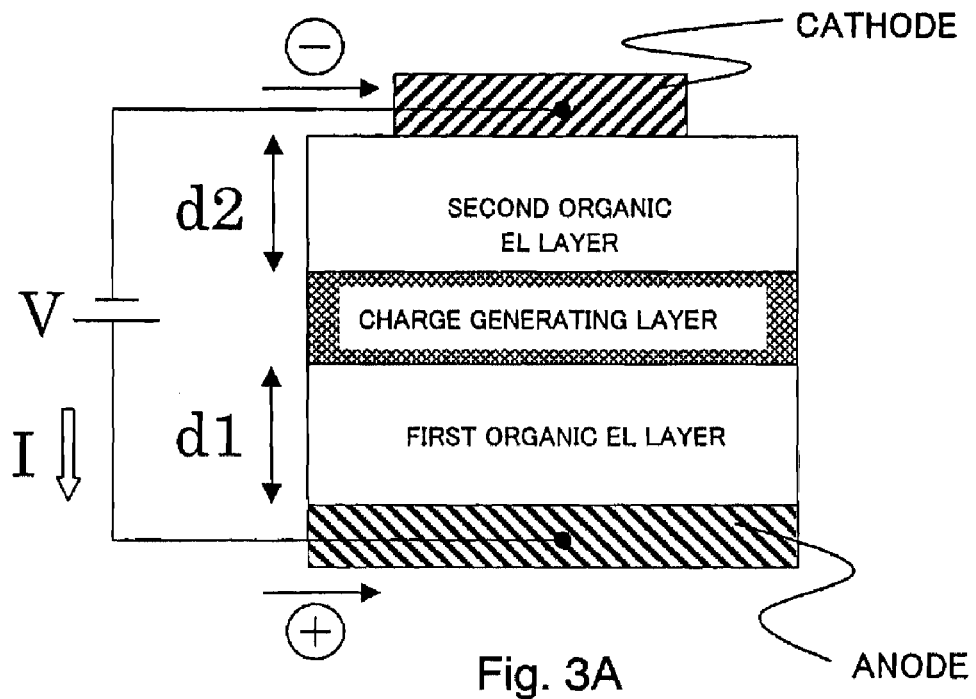
FIGS. 3A and 3B are diagrams each showing an organic EL element having a charge generating layer.
Figure 3B:
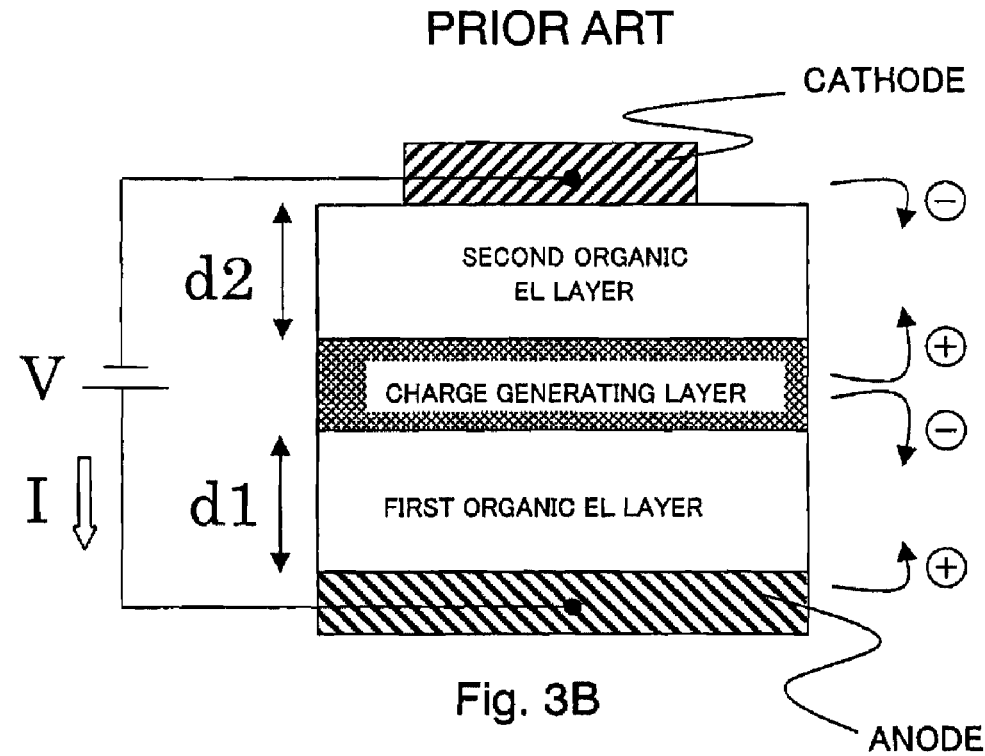

The concept of the charge generating layer is described as shown in FIGS. 3A and 3B. FIGS. 3A and 3B are schematic diagrams each showing an organic EL element in Document 5. In the organic EL element, a positive pole, a first organic EL layer, a charge generating layer, a second organic EL layer and a negative pole are stacked serially. It is important to note that an organic EL layer is a layer containing a field-light-emission type organic material and containing an organic semiconductor material. The charge generating layer is not connected to external circuits and is a floating electrode.

When a voltage V is applied between the positive pole and the negative pole in the organic EL element, electrons and holes are implanted from the charge generating layer to the first organic EL layer and to the second organic EL layer, respectively. Viewing from the external circuit, the holes flow from the positive pole to the negative pole while electrons flow from the negative pole to the positive pole (see FIG. 3A). However, since both of the electrons and holes flow from the charge generating layer toward the opposite directions (see FIG. 3B.), carrier re-coupling occurs in both of the first organic EL layer and the second organic EL layer. Then, light is emitted, Here, when a current I flows therethrough, both first organic EL layer and second organic EL layer can emit photons corresponding to the current I. Therefore, the double amount of light can be emitted with the same current in comparison with the construction having only one organic EL element (where about the double amount of voltage is required in comparison with the construction having only one organic EL element).

The current flowing through the organic EL element here is a current inherent to a thin film. The current is called space charge limited current (SCLC). The SCLC is current flowing when space charges are implanted and are moved). The current density is expressed by the Child's Law, that is, following Expression 1:

$$J = 9/8 * \varepsilon \varepsilon_0 \mu * V^2/d^3 \qquad \text{Expression 1}$$

where J is a current density, $\varepsilon$ is a relative dielectric constant, $\varepsilon_0$ is a vacuum dielectric constant, $\mu$ is a carrier mobility, V is a voltage and d is a depth to which V is applied.

The SCLC expressed by Expression 1 does not assume carrier traps when SCLC flows. The current limited by carrier traps is called trap charge limited current (TCLC) and is proportional to the power of the voltage. However, both of these kinds of current are bulk rate-determining and are handled similarly below.

Here, for comparison, the current density when ohm current in accordance with Ohm's Law flows is expressed by;

$$J = \sigma E = \sigma * V/d \qquad \text{Expression 2}$$

where $\sigma$ is a conductivity and E is an electric field strength.

Since the conductivity $\sigma$ in Expression 2 is expressed by $\sigma = ne\mu$ (where n is a carrier density and e is an amount of charge), the carrier density is included in the dominant factor of the amount of current flowing therethrough. Therefore, ohm current does not flow through an organic material having little carriers in general unless the increase in carrier density is attempted by doping as described above for the organic material having a certain degree of carrier mobility.

However, as expressed in Expression 1, the factors for determining SCLC are the dielectric constant, carrier mobility, voltage and depth to which the voltage is applied and does not associate with the carrier density. In other words, carriers can be injected and current can be fed even to the organic material, which is an insulator without carriers, by selecting a material having the sufficiently small depth d for applying the voltage and the large carrier mobility $\mu$.

Therefore, in FIGS. 3A and 3B, when the thicknesses d1 and d2 of organic EL layers are equal to or smaller than at most 100 nm to 200 nm, carriers injected from the electrode or the charge generating layer can flow therethrough as SCLC. In other words, a proper electrode is mounted to an organic semiconductor film having the thickness of the order of submicron, and a sufficient field (or potential difference) is applied thereto. Thus, carriers can be implanted thereto.

The inventor has proposed a method for operating an organic FET by handling a charge generating layer as a carrier generating-source (or implanting source). The similar floating electrode is called "carrier generating electrode" herein.

Figure 4A:
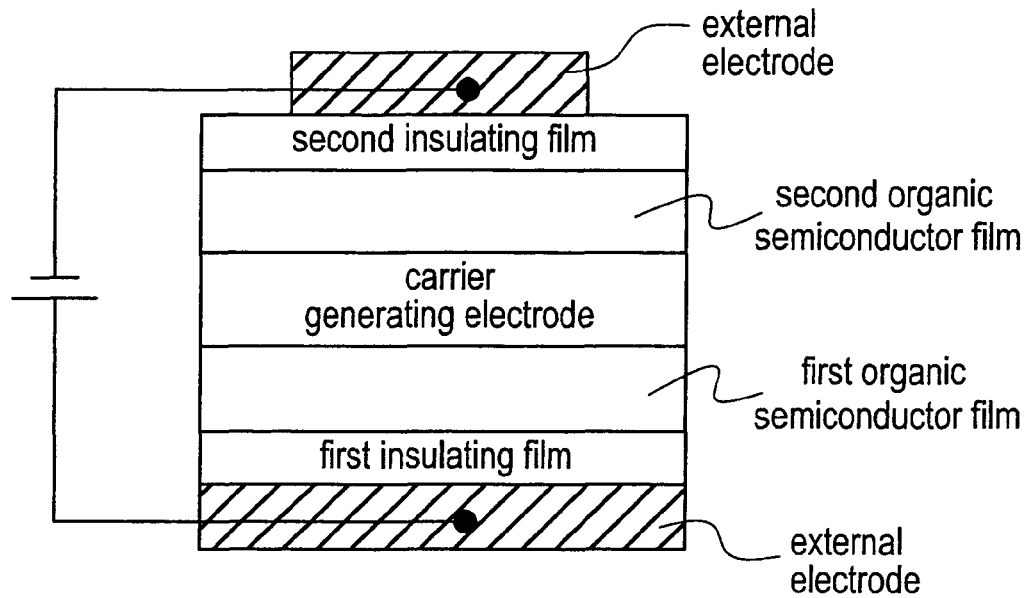
FIGS. 4A and 4B are diagrams each showing a principle of storing charges from a carrier generating electrode.

First of all, in order to store carriers generated by the carrier generating electrode, a construction as shown in the schematic diagram in FIG. 4A may be provided, for example. In other words, a first insulating film, a first organic semiconductor film, a carrier generating electrode, a second organic semiconductor film and a second insulating film are stacked serially. Then, the construction is provided between external electrodes. FIGS. 3A and 3B show the organic EL element designed to re-couple carriers. However, in FIG. 4A, an insulating film is provided between the external electrode and the organic semiconductor film in order to store carriers.

Figure 4B:
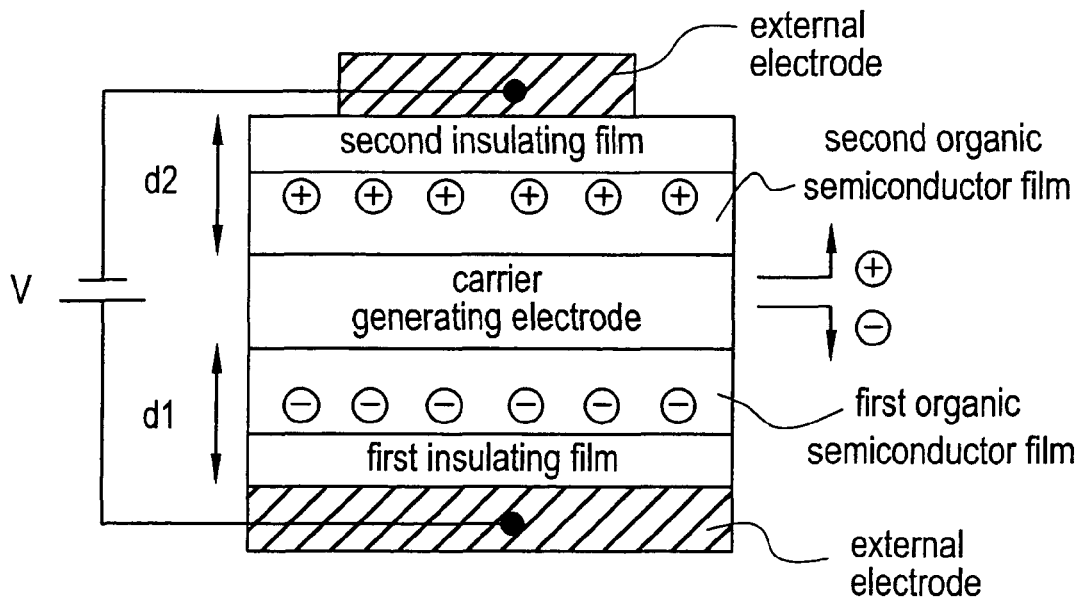

When a potential difference V is provided between the external electrodes in this construction (FIG. 4B), a large amount of carrier is injected from the carrier generating electrode because of the field like the case in FIGS. 3A and 3B if the thicknesses d1 and d2 of the organic semiconductor films are the order of submicron. However, as shown in FIG. 4B, the electrons and holes are stored in the interface between the insulating film and the organic semiconductor film.

According to the principle, the organic semiconductor film implanting the carrier generating electrode is provided between the gate insulating films so that a potential difference can occur. Thus, a large amount of positive and negative carrier can be stored near the gate insulating films above and below the organic semiconductor film. In other words, a positive and negative charge-storing channels are formed near the organic semiconductor film interfaces near the gate insulating films. Therefore, the construction shown in FIGS. 4A and 4B are used to form the source and drain electrodes horizontally in the organic semiconductor film. Then, when a voltage is applied between the source and drain electrodes, hole current and electron current flow through the upper channel and the lower channel, respectively, by using the charge storing channels. In other words, an FET can be obtained for controlling the source-drain current by using a gate voltage to be applied between the upper and lower gate electrodes.

It is important in the FET that the amount of current flowing through the charge storing-channels does not follow Expression 1 for SCLC even when an organic semiconductor film not containing an impurity is used. In other words, the requirement for space charge limit does not exist when the strong field exists for neutralizing the positive or negative charges stored in the charge storing channels. Therefore, even when the potential has a lower gradient due to the source-drain voltage applied to the channel width of several microns or more in the thin channel layer of several tens of nano meter, the stored charges appears to follow Ohm's Law (Expression 2) and can move at a speed determined only by the potential gradient and mobility. As a result, the significantly larger source-drain current than the current determined by SCLC flows. Therefore, a practical FET can be obtained which can control a large amount of current fast.

While the first organic semiconductor film and the second organic semiconductor film may contain the same material, they are preferably contain materials having different polarities. For example, in FIG. 4B, the lower external electrode has a higher potential than that of the upper external electrode. Thus, electrons and holes are implanted to the first organic semiconductor film and the second organic semiconductor film, respectively. Therefore, the first organic semiconductor film and the second organic semiconductor film preferably contain an electron transportable material and hole transportable material, respectively.

Figure 1A:
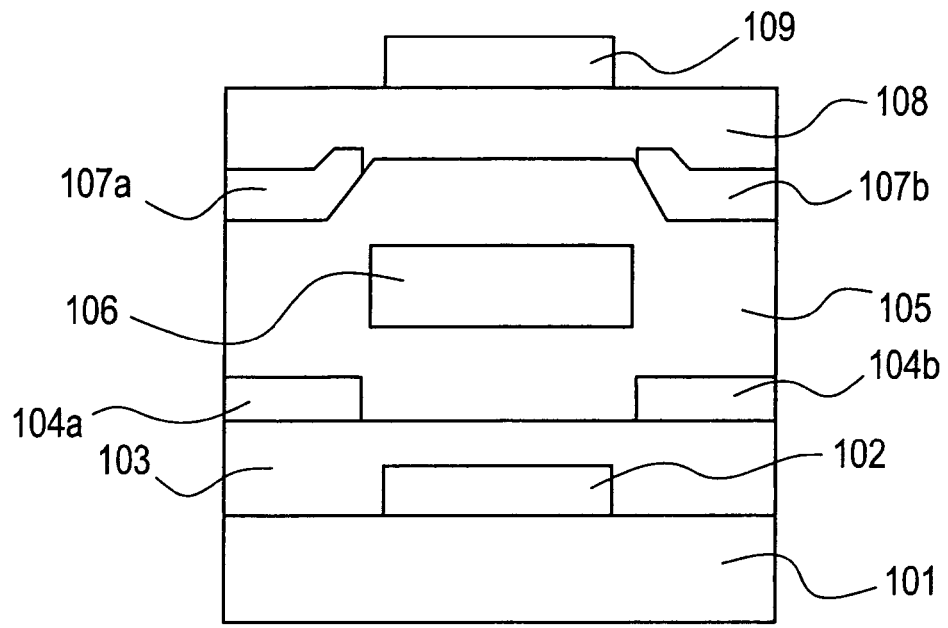
FIGS. 1A and 1B are diagrams each showing a basic construction of the invention.
Figure 1B:
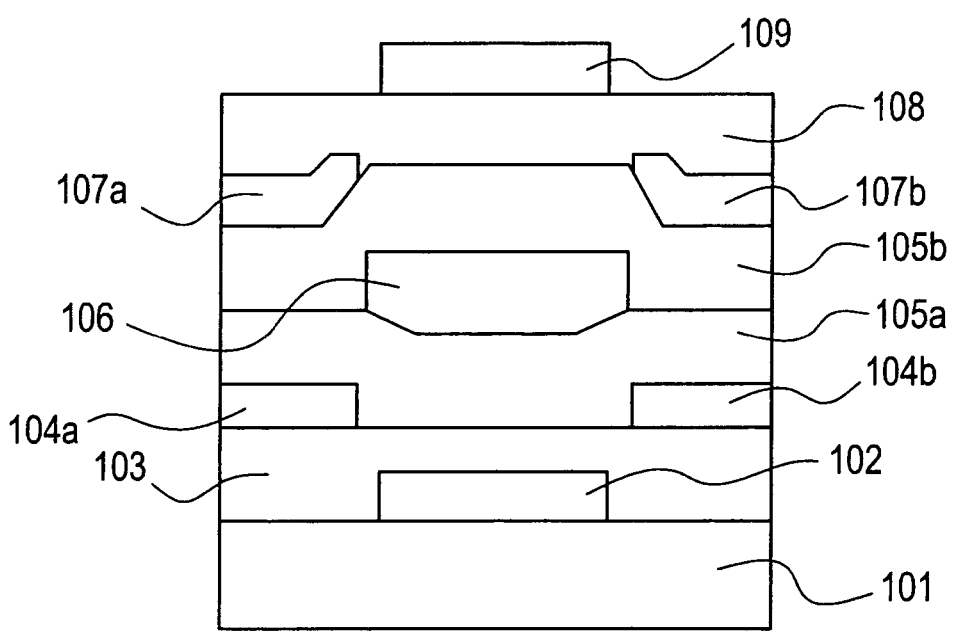
Figure 5A:
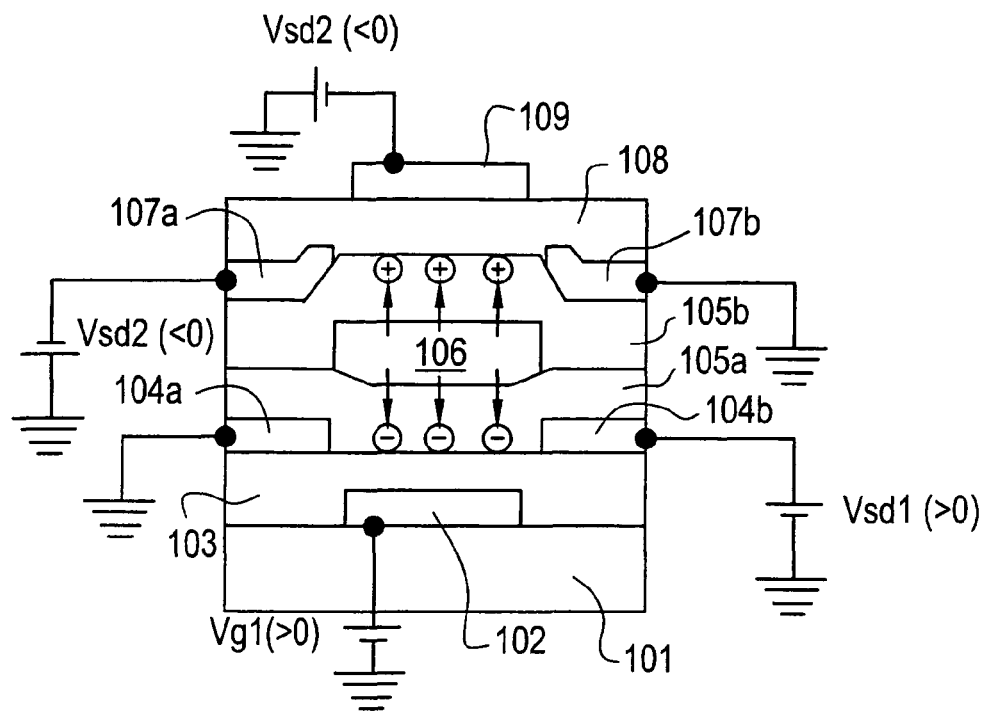
FIGS. 5A and 5B are diagrams each showing an organic field effect transistor of the invention.
Figure 5B:
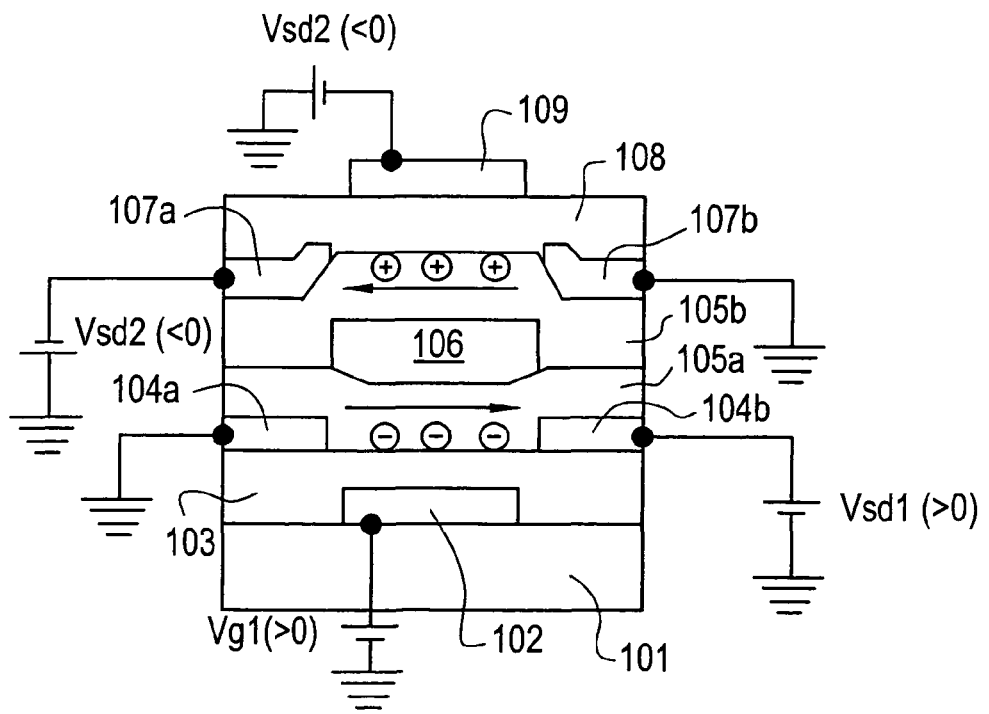

Next, the specific construction and operation of the organic FET according to the invention will be described. First of all, the case where two pairs of source-drain electrodes are provided as shown in FIGS. 1A and 1B, will be described with reference to FIG. 1B, for example. The construction example is shown in FIGS. 5A and 5B. The same reference numerals as those given to the components in FIGS. 1A and 1B are given to like components in FIGS. 5A and 5B.

In FIGS. 5A and 5B, an electron transportable material is used as a first organic semiconductor film 105a, and a hole transportable material is used as a second organic semiconductor film 105b. When Vg1 (>0) and Vg2 (<0) are applied to a first gate electrode 102 and a second gate electrode 109, respectively, in this construction, electrons and holes are implanted from a carrier generating electrode 106 to a first organic semiconductor film 105a (electron transportable) and to the second organic semiconductor film 105b (hole transportable), respectively. Then, the electrons and holes are stored in the organic semiconductor films near the surface of a first gate insulating film 103 and near the surface of a second gate insulating film 108, respectively. As a result, charge-storing channel layers of electrons and holes are obtained.

Here, Vsd1 (>0) and Vsd2 (<0) are applied between a first source electrode 104a and a first drain electrode 104b and between a second source electrode 107b and a second drain electrode 107a, respectively. Then, electrons in the electron charging channel layer near the first gate insulating film 103 and holes in the hole charging channel layer near the second gate insulating film 108 cause current to flow the respective source-drain circuits (FIG. 5B).

The transistor including two gate electrodes and two pairs of source-drain electrodes may be used as a pair of transistors for controlling two independent source-drain currents. In this case, these two transistors are connected by a common carrier generating electrode. Thus, Vg1 and Vsd1 and Vg2 and Vsd2 are not always operated independently. Therefore, the operational characteristics must be examined, and the operational conditions must be optimized.

In order to avoid the complexity due to the circuit and of the operational characteristics, a new idea is required for applying the gate voltage and the source-drain voltage. That is, a potential may be applied between the upper and lower gate electrodes without setting the upper and lower potentials while the upper and lower source-drain electrodes may be connected in series.

Figure 6A:
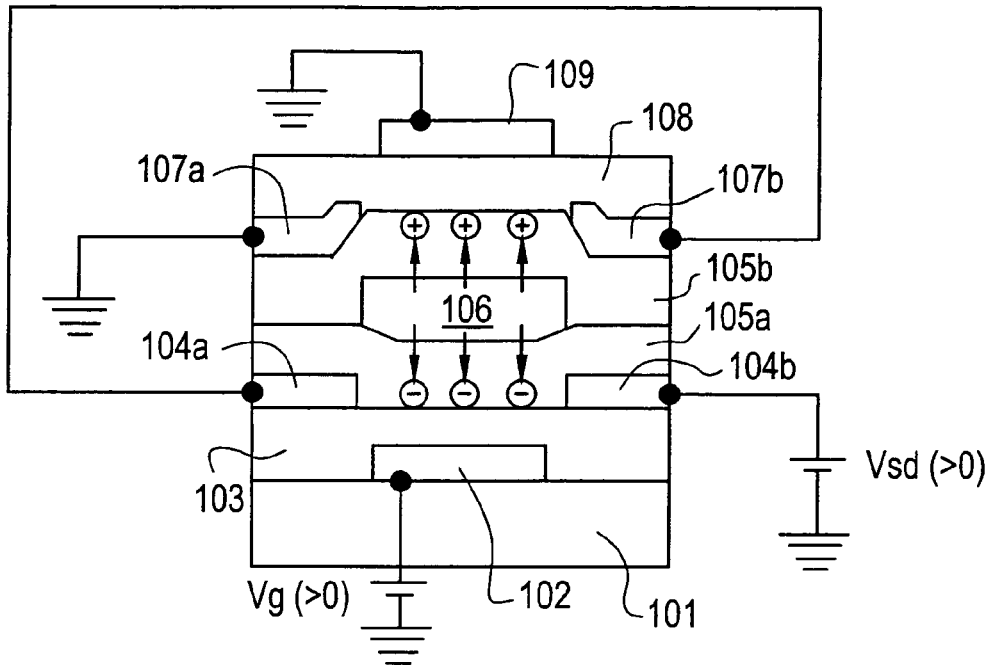
FIGS. 6A and 6B are diagrams each showing an organic field effect transistor of the invention.
Figure 6B:
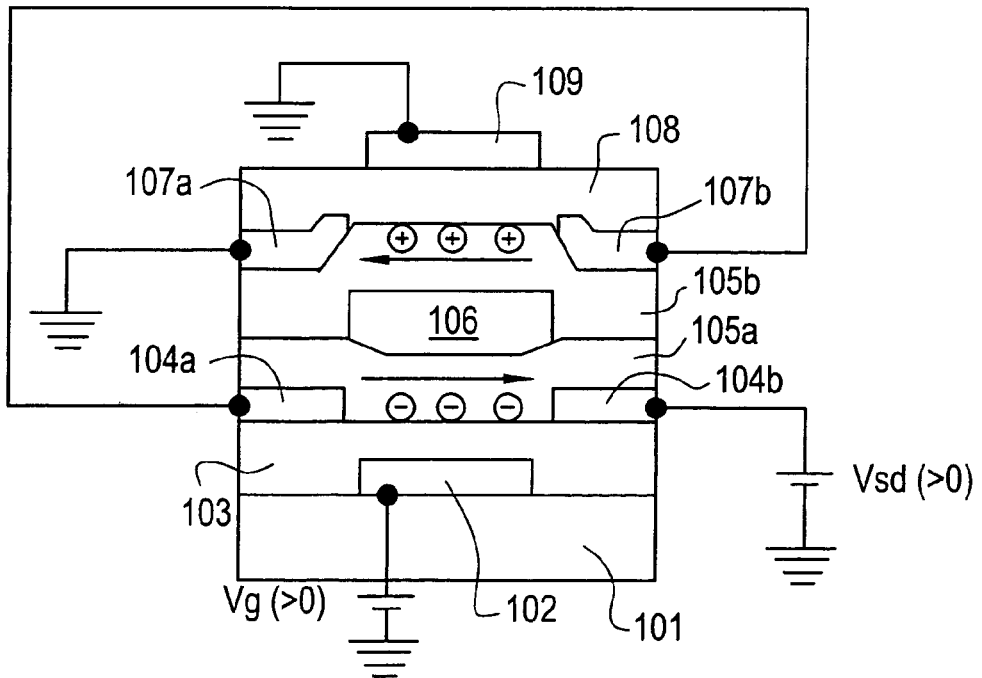

FIGS. 6A and 6B show the example, where the first source electrode 104a and the second source electrode 107b are connected, and the second drain electrode 107a is grounded. Vg (>0) is applied to the first gate electrode 102, and the second gate electrode 109 is grounded. As shown in FIG. 6A, the gate voltage application cause the storage of electrons near the interface of the first gate insulating film 103 and the storage of holes near the interface of the second gate insulating film 108. Here, the current flowing when Vsd (>0) is applied to the first drain electrode 104b is used as the source-drain current (FIG. 6B).

With these connections, even the FET having two gate electrodes and two pairs of source-drain electrodes can operate essentially in the same manner as the FET having one gate electrode and a pair of source-drain electrodes.

In FIGS. 5A to 6B, an electron transportable material is used as the first organic semiconductor film 105a while a hole transportable material is used as the second organic semiconductor film 105b. However, conversely, a hole transportable material may be used as the first organic semiconductor film 105a while an electron transportable material may be used as the second organic semiconductor film 105b. In this case, Vg1<0 and Vg2>0 in FIGS. 5A and 5B. In FIGS. 6A and 6B, Vg<0.

Even when a carrier generating electrode is within a given organic semiconductor film as shown in FIG. 1A, the operational principle is the same. In this case, the organic semiconductor film may contain a bipolar material such that electrons and holes can be implanted and the source-drain current can be fed thereto. Furthermore in this case, the operation is possible by using the optimum carrier generating electrode even when the positive and negative of the voltages to be applied to the first gate electrode and second gate electrode are reversed.

Figure 2A:
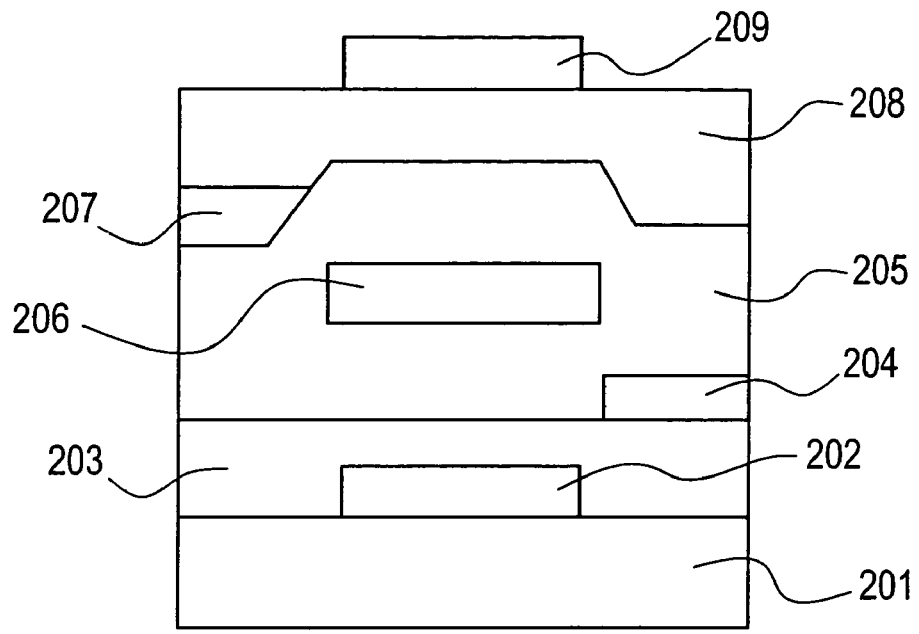
FIGS. 2A and 2B are diagrams each showing a basic construction of the invention.
Figure 2B:
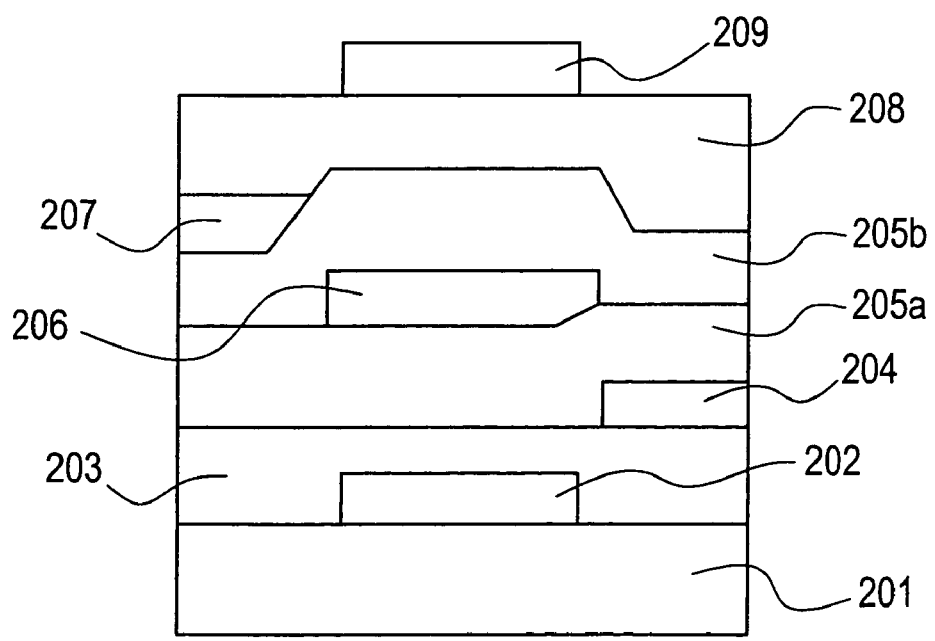
Figure 7A:
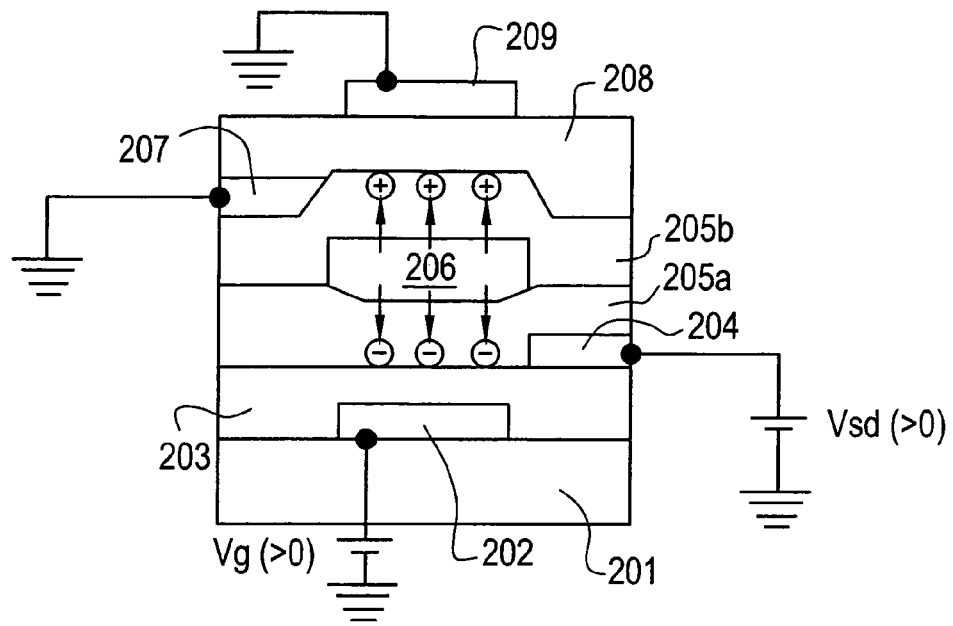
FIGS. 7A and 7B are diagrams showing an organic field-effect transistor of the invention.
Figure 7B:
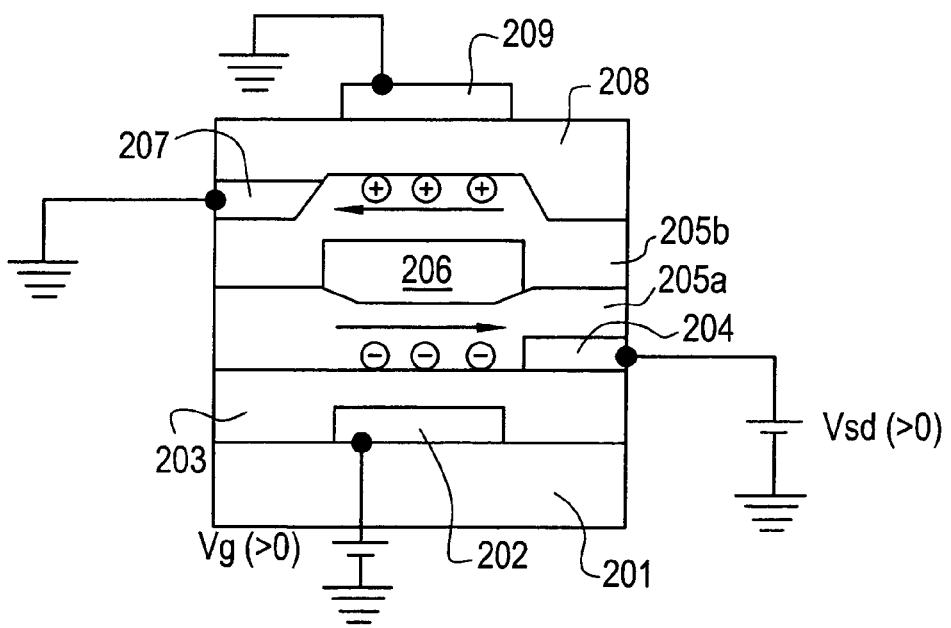
Figure 8A:
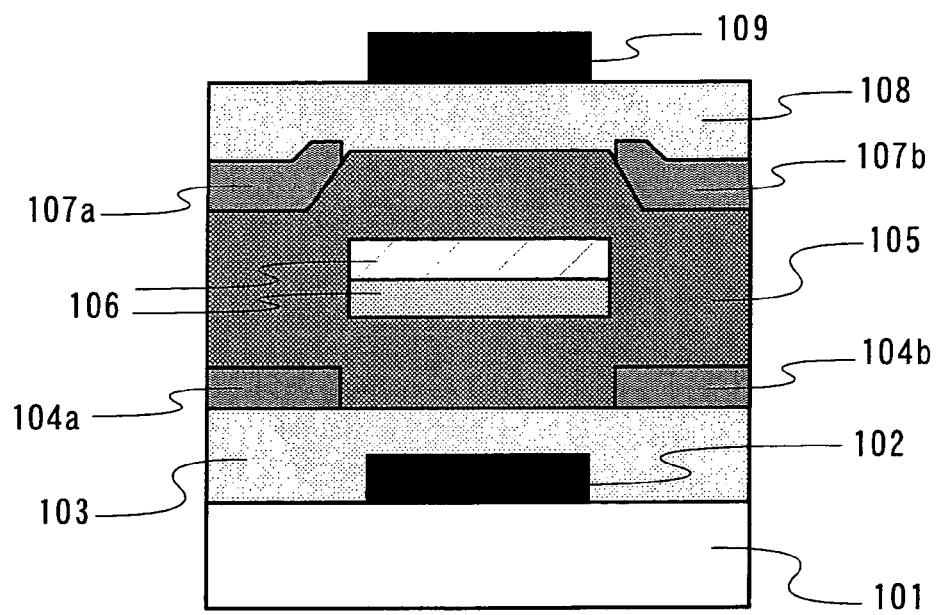
FIGS. 8A and 8B are diagrams each showing a basic construction of the invention.
Figure 8B:
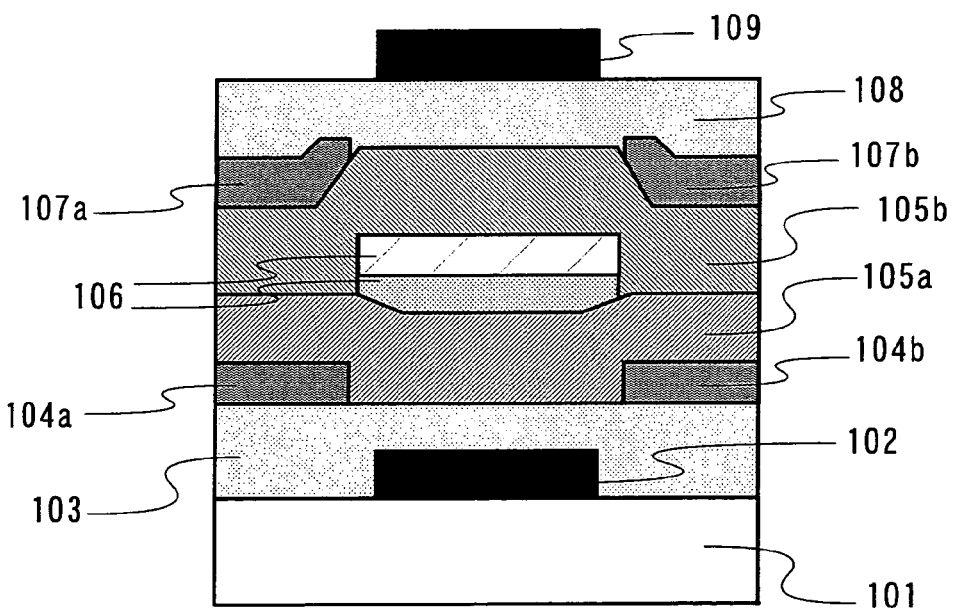
Figure 9A:
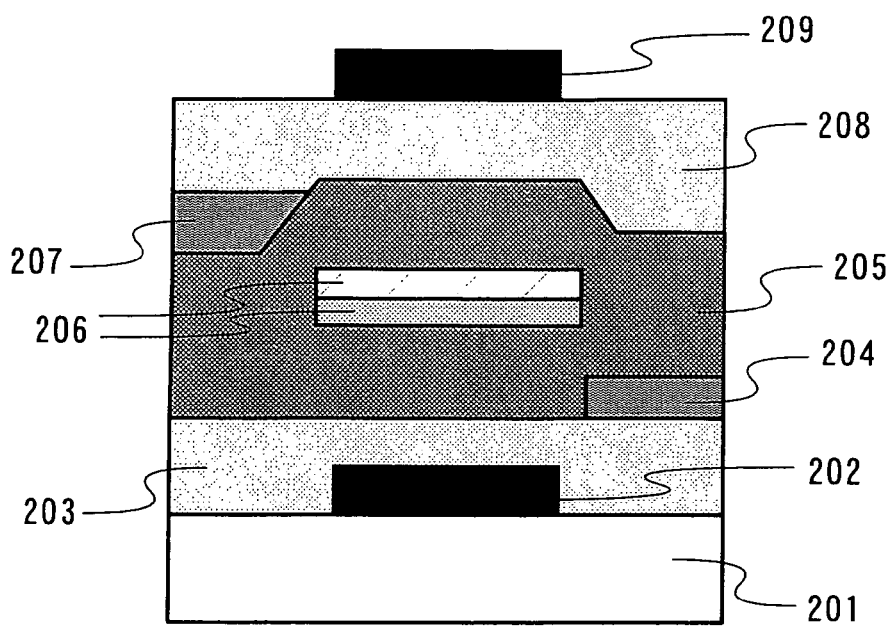
FIGS. 9A and 9B are diagrams each showing a basic construction of the invention.
Figure 9B:
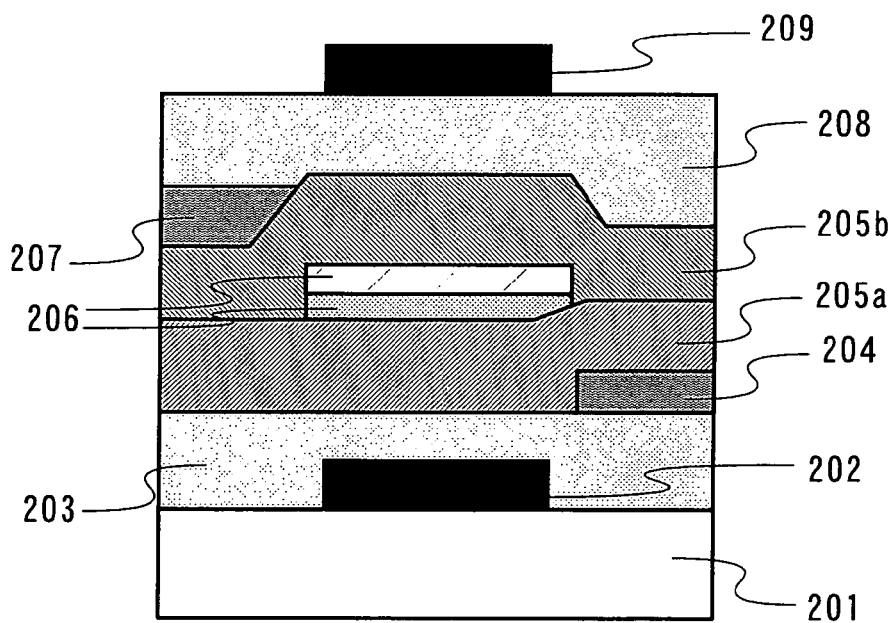

Next, a case where a pair of source-drain electrodes is provided as shown in FIGS. 2A and 2B will be described with reference to FIG. 2B, for example. The construction example is shown in FIGS. 7A and 7B. The same reference numerals in FIGS. 2A and 2B are given to like components in FIGS. 7A and 7B.

In FIGS. 7A and 7B, an electron transportable material is used as a first organic semiconductor film 205a, while a hole transportable material is used as a second organic semiconductor film 205b. The construction is the same as the construction shown in FIGS. 6A and 6B except that, the first source electrode 104a and the second source electrode 107b are removed. In the construction, when Vg (>0) is applied to the first gate electrode 202, electrons and holes are implanted from a carrier generating electrode 206 to a first organic semiconductor film 205a (electron transportable) and to the second organic semiconductor film 205b (hole transportable), respectively. Then, the electrons and holes are stored in the organic semiconductor films near the surface of a first gate insulating film 203 and near the surface of a second gate insulating film 208. Thus, charge storing channel layers for electrons and holes are formed. While a potential difference is formed by using Vg (>0) as the potential of the first gate electrode 202 and the ground potential as the potential of the second gate electrode 209, the second gate electrode 209 may have a negative potential.

Here, Vsd (>0) is applied between the first electrode 204 and the second electrode 207. Then, electrons in the electron-storing channel layer near the first gate insulating film 203 and holes in the hole storing channel layer near the second gate insulating film 208 feed current between the first electrode 204 and the second electrode 207 (FIG. 7B). In this case, an n-type transistor and a p-type transistor connected in series can operate in response to one gate signal.

In FIGS. 7A and 7B, an electron transportable material is used as the first organic semiconductor film 205a while a hole transportable material is used as the second organic semiconductor film 205b. However, conversely, a hole transportable material may be used as the first organic semiconductor film 205a while an electron transportable material may be used as the second organic semiconductor film 205b. In this case, Vg<0. Furthermore, the second gate electrode 209 may have the ground potential or a positive potential.

As shown in FIG. 2A, when a carrier generating electrode is within an organic semiconductor film, the operational principle is the same. In this case, the organic semiconductor film contains a bipolar material such that current can flow between the first electrode and second electrode by implanting electrons and holes to the organic semiconductor film. Furthermore, in this case, the carrier generating electrode is optimized so as to operate even when the positive and negative of the voltage to be applied to the first gate electrode and second gate electrode are reversed.

It is important to note that the carrier generating electrode of the invention may be an electrode containing not only one kind of material but also multiple kinds of material. For example, in FIGS. 5A to 7B, electrons and holes are implanted downward and upward, respectively. Therefore, an electrode to which electrons can be easily implanted (such as a film containing metal having a small work function) is formed. Then, an electrode to which holes can be easily implanted (such as a film containing metal having a large work function) is stacked thereon. In this way, when multiple kinds of material (a material to which electrons can be easily implanted and a material to which holes can be easily implanted) are used, each of the multiple kinds of material preferably has the Ohmic contact.

Furthermore, when carrier generating electrode contains multiple kinds of materials, the electron implanted electrode and positive hole implanted buffer layer or the positive hole implanted electrode and the electron injection buffer layer can be paired. The positive hole implanted buffer layer and electron implanted buffer layer used herein do not always have to function as electrodes and only needs to promote the carrier implanting from the electron implanted electrode or the positive hole implanted electrode. For example, in FIGS. 5A to 7B, electrons and positive holes are implanted downward and upward, respectively. Therefore, an electrode to which electrons can be easily implanted (such as a film containing metal having a low work function) is formed first. Then, a positive hole implanted buffer layer to which positive holes can be easily implanted (such as a combination film containing an acceptor-type organic semiconductor material and a positive-hole transportable organic semiconductor material) is stacked thereon.

When the carrier generating electrode contains a single material, the material must be able to accept the implanted of both electrons and holes. In this case, the material may be an intrinsic semiconductor having holes and electrons in a valence electron band and in a conductor, respectively, or redox polymer, which can be oxidized and be reduced.

The basic operational principle and construction of the invention has been described above. Now, preferable materials to be contained in an organic thin film transistor of the invention will be listed below. However, the invention is not limited thereto.

The materials of the substrate may include silicon wafer, glass, indium tin oxide, mica, graphite, molybdenum sulfide, metal such as copper, zinc, aluminum, stainless, magnesium, iron, nickel, gold and silver, plastic film such as polyimide, polyester, polycarbonate and acrylic resin. However, the materials are not limited thereto.

The materials for the gate insulating film may include polymer thin films of, for example, poly(vinylphenol), poly (p-xylylene) and the derivatives thereof, polyimide and the derivatives, polyacrylonitrile, poly(methalmethacrylate), polystyrene, polyphenol derivatives, polyurea, polyethylene, polypropylene, polyvinylchloride, polyvinylidene, polyvinyle fluoride, and cellulose acetate and the derivatives thereof, a metal oxides thin film of, for example, alumina, an inorganic oxides thin film of, for example, silica, and a silicon nitride thin film. The gate insulating film may be formed by a wet method by spin-coating, a dry method for forming a parylene film by vacuum deposition, a thin film forming method by electrolytic oxidation, an electrolytic polymerization, and a method for forming a thin film of silica and/or alumina by sputtering. However, the material and the method are not limited thereto.

The materials of the organic semiconductor film may include polymer, typically conjugate polymer, and origomer, such as polyphenylenevinylene derivatives, polyfluorene derivatives, polythiophne dielectrics, polyphenylene derivatives and the copolymer thereof, and aromatic hydrocarbon origometer such as origophenylene, origothiophene, and origophenilenevinylene. In this case, wet methods may be used such as spin coating, dip coating, ink-jet printing, screen printing and spray coating. Vacuum evaporation method is mainly used for low polymer materials such as pentacene, tetracene, copper phtalocyanine, fluorine substitution phtalocyanine and perylene derivatives. However, electrolytic polymerization method, electrolytic precipitation method or the like may be used.

The carrier generating electrode may be a metal thin film, a metal oxide thin film, an organic conductor thin film, an organic semiconductor film or the combination thereof. The carrier generating electrode may be provided between a negative-pole side buffer layer and a positive-pole side buffer layer. The negative-pole side buffer layer may be an inorganic dielectric thin film such as LiF and an organic thin film layer containing metal oxide such as Li oxide, alkali metal and/or alkali earth metal ion. The positive-pole side buffer layer may contain an acceptor type organic semiconductor material such as TCNQ and F4-TCNQ, an acceptor type inorganic semiconductor material such as $VO_x$, and copper phtalocyanine. The electrode used as the carrier generating electrode may include such a buffer layer herein.

The materials for the gate electrode, source electrode and drain electrode (or the first electrode and second electrode) may include one or more types of metal such as gold, copper, aluminum, platinum, chrome, palladium, indium, nickel, magnesium, silver and gallium or the alloy thereof, oxide semiconductors such as tine-indium oxide, polysilicon, amorphous silicon, tin oxide, indium oxide and titan oxide, and compound semiconductors such as gallium arsenic and gallium nitride. However, the materials are not limited thereto.

EXAMPLES

Example 1

In this example, the organic FET shown in FIG. 1B will be illustrated specifically. First of all, gold film of 50 nm thickness is formed by vacuum evaporation on a glass substrate through a mask having a first gate electrode pattern. Thus, the first gate electrode having each side length of 500 μm is formed.

The glass substrate is moved to a chemical evaporation apparatus. Xylylene Dimer (product name: parylene, manufactured by Japan Parylene) is heated under decompression, and a heating tube heated at 680° C. is inserted therethrough for pyrosis. Thus, radical monomer is generated. The generated radical monomer is introduced onto the substrate maintained at a room temperature, and a poly(p-xylylene) film of 300 nm thickness is formed. This is the first gate insulating film.

Next, in order to form a first source electrode and a first drain electrode, a mask pattern is provided such that the source-drain length can be 50 μm. Thus, a gold thin film of 50 nm thickness is formed.

Tris(8-quinolinolato)aluminum complex ($Alq_3$), that is an electron transportable material, having 50 nm thickness is formed thereon by vacuum evaporation so as to cover the entire substrate. This is the first organic semiconductor film.

As a carrier generating electrode, that is a floating electrode, a combination layer of magnesium and $Alq_3$ having thickness of 10 nm and $V_2O_5$ buffer layer of 10 nm thickness are serially formed on the upper surface through a mask pattern by vacuum evaporation. This functions as the carrier generating electrode having a buffer layer.

N,N'-dipbenyl-N,N'-(bis-3-methylphenyl)-1,1'-diphenyl-4, and 4'-diamine (TPD), which are a positive hole transportable materials, are formed with thickness of 50 nm thereon so as to cover the entire substrate. This is the second organic semiconductor film.

Furthermore, in order to form a second source electrode and a second drain electrode, a mask pattern is produced such that the source-drain length can be 50 μm. Then, a gold thin film of 50 nm thickness is formed. The mask pattern may be the same as the mask pattern for forming the first source electrode and the first drain electrode.

Next, the glass substrate is moved to a chemical evaporation apparatus. Xylylene Dimer (product name: parylene, manufactured by Japan Parylene) is heated under decompression, and a heating tube heated at 680° C. is inserted therethrough for pyrosis. Thus, radical monomer is generated. The generated radical monomer is introduced onto the substrate maintained at a room temperature, and a poly(p-xylylene) thin film of 300 nm thickness is formed. This is the second gate insulating film.

Finally, gold film of 50 nm thickness is formed thereon by vacuum evaporation through a mask having a second gate electrode pattern. Thus, the second gate electrode having each side length of 500 μm is formed. The mask pattern may be the same as the mask pattern for forming the first gate electrode.

The produced organic FET is moved to a measuring container. After the container is evacuated, the element characteristic is measured.

Example 2

In this example, the organic FET shown in FIG. 1B will be illustrated specifically. First of all, gold film of 50 nm thickness is formed by vacuum evaporation on a glass substrate through a mask having a first gate electrode pattern. Thus, the first gate electrode having each side length of 500 μm is formed.

The glass substrate is moved to a chemical evaporation apparatus. Xylylene Dimer (product name: parylene, manufactured by Japan Parylene) is heated under decompression, and a heating tube heated at 680° C. is inserted therethrough for pyrosis. Thus, radical monomer is generated. The generated radical monomer is introduced onto the substrate maintained at a room temperature, and a poly(p-xylylene) film having 300 nm thickness is formed. This is the first gate insulating film.

Next, in order to form a first source electrode and a first drain electrode, a mask pattern is provided such that the source-drain length can be 50 μm. Thus, a gold thin film having 50 nm thickness is formed.

Copper 1,2,3,4,8,9,10,11,15,16,17,18,22,23,24, 25-Hexadecafluorophthalocyanine (F16-CuPC), that is an n-type semiconductor material, is formed thereon to have a film thickness of 50 nm by vacuum evaporation so as to cover the entire substrate. This is the first organic semiconductor film.

As a carrier generating electrode, that is a floating electrode, a combination layer of magnesium and F16-CuPC having thickness of 10 nm and $V_2O_5$ buffer layer having thickness of 10 nm are serially formed on the upper surface through a mask pattern by vacuum evaporation. This functions as the carrier generating electrode having a buffer layer.

Furthermore, pentacene, which is a p-type organic semiconductor material, having thickness of 50 nm thick is formed thereon so as to cover the entire substrate. This is the second organic semiconductor film.

Furthermore, in order to form a second source electrode and a second drain electrode, a mask pattern is produced such that the source-drain length can be 50 μm. Then, a gold thin film of 50 nm thickness is formed. The mask pattern may be the same as the mask pattern for forming the first source electrode and the first drain electrode.

Next, the glass substrate is moved to a chemical evaporation apparatus. Xylylene Dimer (product name: parylene, manufactured by Japan Parylene) is heated under decompression, and a heating tube heated at 680° C. is inserted therethrough for pyrosis. Thus, radical monomer is generated. The generated radical monomer is introduced onto the substrate maintained at a room temperature, and a poly(p-xylylene) thin film having thickness of 300 nm is formed. This is the second gate insulating film.

Finally, gold film of 50 nm thickness is formed thereon by vacuum evaporation through a mask having a second gate electrode pattern. Thus, the second gate electrode having each side length of 500 μm is formed. The mask pattern may be the same as the mask pattern for forming the first gate electrode. The produced organic FET is moved to a measuring container. After the container is evacuated, the element characteristic is measured.

Example 3

In this example, the organic FET shown in FIG. 1B will be illustrated specifically. First of all, gold film of 50 nm thickness is formed by vacuum evaporation on a glass substrate through a mask having a first gate electrode pattern. Thus, the first gate electrode having each side length of 500 μm is formed.

The glass substrate is moved to a chemical evaporation apparatus. Xylylene Dimer (product name: parylene, manufactured by Japan Parylene) is heated and is vaporized under decompression, and a heating tube heated at 680° C. is inserted therethrough for pyrosis. Thus, radical monomer is generated. The generated radical monomer is introduced onto the substrate maintained at a room temperature, and a poly (p-xylylene) thin film having 300 nm thickness is formed. This is the first gate insulating film.

Next, in order to form a first source electrode and a first drain electrode, a mask pattern is provided such that the source-drain length can be 50 μm. Thus, a gold thin film of 50 nm thickness is formed.

Tris(8-quinolinolato)aluminum complex ($Alq_3$), that is an electron transportable material, is formed thereon by vacuum evaporation to have the film thickness of 50 nm so as to cover the entire substrate. This is the first organic semiconductor film.

An LiF buffer layer of 5 nm thickness, an aluminum thin film layer of 100 nm thickness and copper phtalocyanine buffer layer of 5 nm thickness are serially formed on the upper surface through a mask having a pattern for a carrier generating electrode, which is a floating electrode, by vacuum evaporation. This functions as the carrier generating electrode having a buffer layer.

N,N'-diphenyl-N,N'-(bis-3-methylphenyl)-1,1'-diphenyl-4, and 4'-diamine (TPD), which are a positive hole transportable materials, are formed thereon to have a thickness of 50 nm so as to cover the entire substrate. This is the second organic semiconductor film.

Furthermore, in order to form a second source electrode and a second drain electrode, a mask pattern is produced such that the source-drain length can be 50 μm. Then, a gold thin film of 50 nm thickness is formed. The mask pattern may be the same as the mask pattern for forming the first source electrode and the first drain electrode.

Next, the glass substrate is moved to a chemical evaporation apparatus. Xylylene Dimer (product name: parylene, manufactured by Japan Parylene) is heated under decompression, and a heating tube heated at 680° C. is inserted therethrough for pyrosis. Thus, diradical monomer is generated. The generated diradical monomer is introduced onto the substrate maintained at a room temperature, and a poly(p-xylylene) thin film of 300 nm thickness is formed. This is the second gate insulating film.

Finally, gold film of 50 nm thickness is formed thereon by vacuum evaporation through a mask having a second gate electrode pattern. Thus, the second gate electrode having each side length of 500 μm is formed. The mask pattern may be the same as the mask pattern for forming the first gate electrode. The produced organic FET is moved to a measuring container. After the container is evacuated, the element characteristic is measured.

Example 4

In this example, the organic FET shown in FIG. 1A will be illustrated specifically. First of all, gold film of 50 nm thickness is formed by vacuum evaporation on a glass substrate through a mask having a first gate electrode pattern. Thus, the first gate electrode having each side length of 500 μm is formed.

Furthermore, a water solution of polyvinylphenol is coated on the glass substrate by spin-coating, and the first gate insulating film is formed.

Next, in order to form a first source electrode and a first drain electrode, a mask pattern is provided such that the source-drain length can be 50 μm. Thus, a gold thin film of 50 nm thickness is formed.

A film of a chloroform solution of regioregular poly(3-octylthiophene-2,5-diyl) (P3OT) is formed by spin-coating so as to cover the entire surface of the substrate. Thus, an organic semiconductor film having 50 nm thickness is formed.

Next, a polyethelenedioxithiophene/polystylene-sulfonic acid (PEDOT/PSS) thin film of 50 nm thickness is formed as a buffer layer by spin coating from a water solution. A gold thin film layer having 100 nm thickness is formed on the upper surface through a mask having a pattern for a floating electrode by vacuum evaporation. A poly ethelene-di-oxithiophene/polystylenesulfonic acid (PEDOT/PSS) thin film of 50 nm thickness is formed again on the upper surface as a buffer layer by spin coating. This functions as the carrier generating electrode having buffer layers.

A film of a chloroform solution of regioregular poly(3-octylthiophene-2,5-diyl) (P3OT) is formed thereon by spin-coating so as to cover the entire surface of the substrate. Thus, an organic semiconductor film having 50 nm thickness is formed. As a result, a construction can be obtained in which the carrier generating electrode is implanted within the same organic semiconductor film.

Furthermore, in order to form a second source electrode and a second drain electrode, a mask pattern is produced such that the source-drain length can be 50 μm. Then, a gold thin film of 50 nm thickness is formed. The mask pattern may be the same as the mask pattern for forming the first source electrode and the first drain electrode.

Furthermore, a water solution of polyvinylphenol is coated on the glass substrate by spin-coating, and the first gate insulating film is formed.

Finally, gold film of 50 nm thickness is formed thereon by vacuum evaporation through a mask having a second gate electrode pattern. Thus, the second gate electrode having each side length of 500 μm is formed. The mask pattern may be the same as the mask pattern for forming the first gate electrode. The produced organic FET is moved to a measuring container. After the container is evacuated, the element characteristic is measured.

What is claimed is:

1. An organic field effect transistor comprising:
   a first gate electrode over and in contact with an insulating surface over a substrate;
   a first gate insulating film over and in contact with the first gate electrode;
   a first source electrode and first drain electrode over and in contact with the first gate insulating film;
   an organic semiconductor film over and in contact with the first source electrode, the first drain electrode, and the first gate insulating film;
   a floating electrode in the organic semiconductor film;
   a second source electrode and a second drain electrode over and in contact with the organic semiconductor film;
   a second gate insulating film over and in contact with the organic semiconductor film; and
   a second gate electrode over and in contact with the second gate insulating film,
   wherein the floating electrode comprises:
      a negative pole side buffer layer which is an organic thin film layer comprising an alkali metal ion or an alkali earth metal ion; and
      a positive pole side buffer layer containing an acceptor type inorganic semiconductor material.

2. An organic field effect transistor comprising:
   a first gate electrode over and in contact with an insulating surface over a substrate;
   a first gate insulating film over and in contact with the first gate electrode;
   a first source electrode and first drain electrode over and in contact with the first gate insulating film;
   a first organic semiconductor film over and in contact with the first source electrode, the first drain electrode, and the first gate insulating film;
   a floating electrode over and in contact with the first organic semiconductor film;
   a second organic semiconductor film over and in contact with the first organic semiconductor film and the floating electrode;
   a second source electrode and a second drain electrode over and in contact with the second organic semiconductor film;
   a second gate insulating film over and in contact with the second organic semiconductor film; and
   a second gate electrode formed in contact with the second gate insulating film,
   wherein the floating electrode comprises:
      a negative pole side buffer layer which is an organic thin film layer comprising an alkali metal ion or an alkali earth metal ion; and
      a positive pole side buffer layer containing an acceptor type inorganic semiconductor material.

3. The organic field effect transistor according to claim 2, wherein the first organic semiconductor film is hole transportable, and the second organic semiconductor film is electron transportable.

4. The organic field effect transistor according to claim 2, wherein the first organic semiconductor film is electron transportable, and the second organic semiconductor film is hole transportable.

5. The organic field effect transistor according to claim 1, wherein the first source electrode and the second source electrode are connected.

6. The organic field effect transistor according to claim 2, wherein the first source electrode and the second source electrode are connected.

7. The organic field effect transistor according to claim 1, wherein the first drain electrode and the second drain electrode are connected.

8. The organic field effect transistor according to claim 2, wherein the first drain electrode and the second drain electrode are connected.

9. An organic field effect transistor comprising:
   a first gate electrode over and in contact with an insulating surface over a substrate;
   a first gate insulating film over and in contact with the first gate electrode;
   a first electrode over and in contact with the first gate insulating film;
   an organic semiconductor film over and in contact with the first electrode and the first gate insulating film;
   a floating electrode in the organic semiconductor film;
   a second electrode over and in contact with the organic semiconductor film;
   a second gate insulating film over and in contact with the organic semiconductor film; and
   a second gate electrode over and in contact with the second gate insulating film,
   wherein the floating electrode comprises:

a negative pole side buffer layer which is an organic thin film layer comprising an alkali metal ion or an alkali earth metal ion; and a positive pole side buffer layer containing an acceptor type inorganic semiconductor material.

10. An organic field effect transistor comprising:

a first gate electrode over and in contact with an insulating surface over a substrate;

a first gate insulating film over and in contact with the first gate electrode;

a first electrode over and in contact with the first gate insulating film;

a first organic semiconductor film over and in contact with the first electrode and the first gate insulating film;

a floating electrode over and in contact with the first organic semiconductor film;

a second organic semiconductor film over and in contact with the first organic semiconductor film and the floating electrode;

a second electrode over and in contact with the second organic semiconductor film;

a second gate insulating film over and in contact with the second organic semiconductor film; and a second gate electrode over and in contact with the second gate insulating film, wherein the floating electrode comprises:

a negative pole side buffer layer which is an organic thin film layer comprising an alkali metal ion or an alkali earth metal ion; and a positive pole side buffer layer containing an acceptor type inorganic semiconductor material.

11. The organic field effect transistor according to claim 10, wherein the first organic semiconductor film is hole transportable, and the second organic semiconductor film is electron transportable.

12. The organic field effect transistor according to claim 10, wherein the first organic semiconductor film is electron transportable, and the second organic semiconductor film is hole transportable.

13. An organic field effect transistor comprising:

a substrate having an insulating surface;

a gate electrode over the substrate;

a gate insulating film over and in contact with the gate electrode;

an organic semiconductor film over and in contact with the gate insulating film;

a source electrode and a drain electrode over and in contact with the organic semiconductor film; and a floating electrode in the organic semiconductor film, wherein the floating electrode comprises:

a negative pole side buffer layer which is an organic thin film layer comprising a an alkali metal ion or an alkali earth metal ion; and a positive pole side buffer layer containing an acceptor type inorganic semiconductor material.

14. The organic field effect transistor according to claim 13, wherein the floating electrode is embedded in the organic semiconductor film, and wherein the floating electrode is separated from the source electrode and the drain electrode.

15. The organic field effect transistor according to claim 13, wherein the organic semiconductor film comprises two layers.

16. The organic field effect transistor according to claim 13, further comprising an insulating film over the organic semiconductor film.

17. The organic field effect transistor according to claim 1, wherein the acceptor type inorganic semiconductor material is vanadium oxide.

18. The organic field effect transistor according to claim 2, wherein the acceptor type inorganic semiconductor material is vanadium oxide.

19. The organic field effect transistor according to claim 9, wherein the acceptor type inorganic semiconductor material is vanadium oxide.

20. The organic field effect transistor according to claim 10, wherein the acceptor type inorganic semiconductor material is vanadium oxide.

21. The organic field effect transistor according to claim 13, wherein the acceptor type inorganic semiconductor material is vanadium oxide.

* * * * *